United States Patent [19]

Shimizu

[11] Patent Number: 4,824,006

[45] Date of Patent: Apr. 25, 1989

[54] DIE BONDING APPARATUS

[75] Inventor: Yasuhiko Shimizu, Yokohama, Japan

[73] Assignee: Kabushiki Kaisha Toshiba, Kawasaki, Japan

[21] Appl. No.: 154,007

[22] Filed: Feb. 9, 1988

[30] Foreign Application Priority Data

Feb. 9, 1987 [JP] Japan ................................ 62-27660

[51] Int. Cl.⁴ .............................................. B23K 3/06
[52] U.S. Cl. ...................................... 228/10; 228/11; 228/248; 118/668
[58] Field of Search ................... 228/10, 11, 248, 102, 228/179; 118/668

[56] References Cited

U.S. PATENT DOCUMENTS 4,485,957 12/1984 Sugimoto et al. ................... 228/10
4,607,782 8/1986 Mims ..................................... 28/248

FOREIGN PATENT DOCUMENTS 39467 3/1984 Japan ................................... 228/248
135476 6/1986 Japan ..................................... 228/11

Primary Examiner—Nicholas P. Godici
Assistant Examiner—Samuel M. Heinrich
Attorney, Agent, or Firm—Foley & Lardner, Schwartz, Jeffery, Schwaab, Mack, Blumenthal & Evans

[57] ABSTRACT

A die bonding apparatus comprising a paste supply section having a needle for supplying paste onto a package to secure a semiconductor pellet, a driving section for moving the paste supply section in the directions of X, Y and Z, respectively, a follow-up mechanism movable up and down for causing the tip of the needle to follow the contour of the paste application surface of the package and a support mechanism for supporting the paste supply section through the follow-up mechanism.

5 Claims, 3 Drawing Sheets

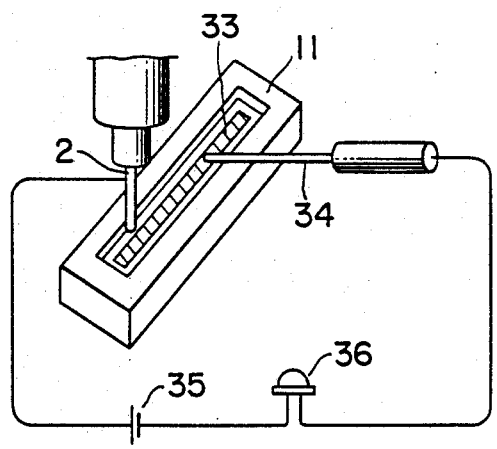
FIG. 7
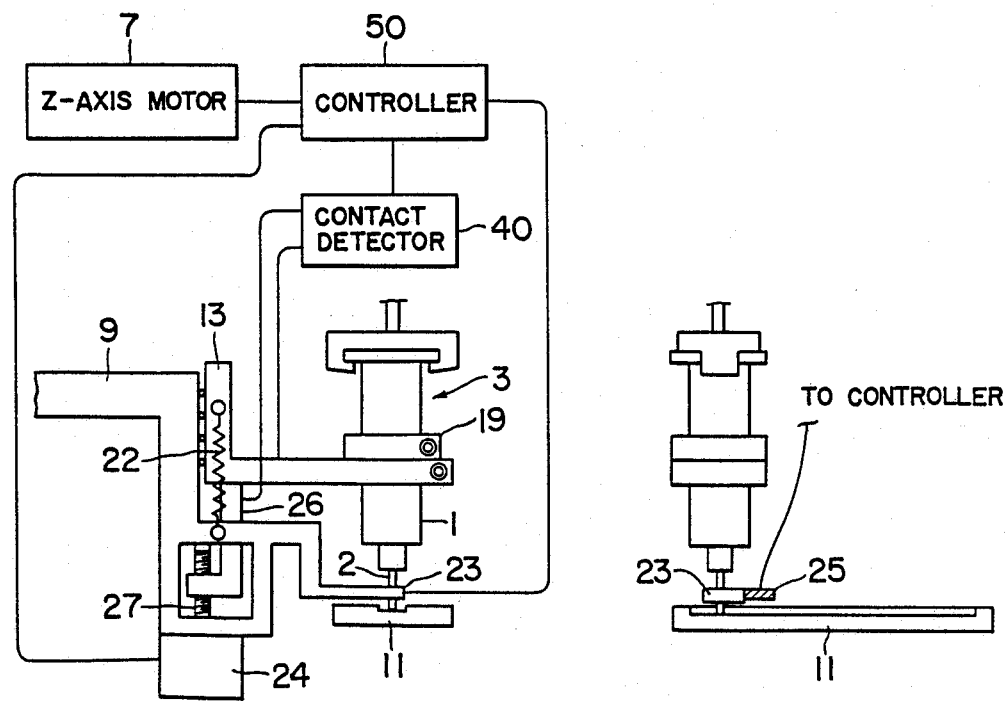
FIG. 8A
FIG. 8B

DIE BONDING APPARATUS

BACKGROUND OF THE INVENTION

This invention relates to a die bonding apparatus and more particularly to a die bonding apparatus which bonds an elongated semiconductor pellet (chip) in a package.

A conventional die bonding apparatus is of a type wherein the apparatus performs positioning of a syringe in which bonding paste is filled, in the X, Y and Z directions of rectangular coordinates by using a positioning mechanism, and injects the paste onto the surface of a package.

In use of the apparatus of this type for die bonding an elongated pellet such as a solid state image device, the uniformity of paste application width and thickness is often lost when a space between a needle tip and a paste application surface is varied due to the variation in height of the package or occurrence of inclination of the package. As a result of these phenomena, there is a drawback such that the reliability of the product is lowered.

SUMMARY OF THE INVENTION

Accordingly, the object of the present invention is to provide a die bonding apparatus which can apply paste onto the surface to be applied, and which is suitable for use especially in die bonding of an elongated pellet to a package.

In accordance with the present invention, the apparatus comprises paste supply means having a needle for supplying paste onto a package to secure a semiconductor pellet, driving means for moving the paste supply means in the directions of X, Y and Z, respectively, follow up means movable up and down for causing the tip of the needle to follow the contour of the paste application surface of the package, and support means for supporting the paste supply means through the follow up means.

BRIEF DESCRIPTION OF THE DRAWINGS

In the accompanying drawings:

FIG. 7 shows another detecting method for detecting the contact; and

FIG. 8A and FIG. 8B are a front view and a side view, respectively, of another embodiment of the present invention.

DESCRIPTION OF THE PREFERRED EMBODIMENT

Figure 1:
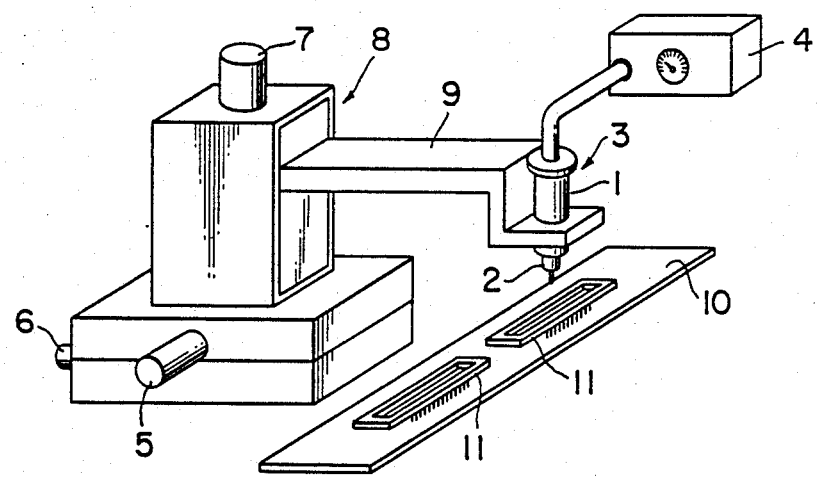
FIG. 1 shows a conventional die bonding apparatus.

At first, a construction and problems of a conventional die bonding apparatus will be described referring to the drawings.

As shown in FIG. 1, a conventional die bonding apparatus has a paste supply section 3 which comprises a syringe 1 in which paste, e.g., conductive adhesive is filled and a needle 2 which has an inner diameter for applying a proper amount of paste and is connected to the tip of the syringe 1. The paste supply section 3 is coupled to a dispense controller 4 which controls discharge time and discharge pressure for discharging the paste, and is mounted on the driving section 8 which drives the syringe 1 by X-axis motor 5, Y-axis motor 6, and Z-axis motor 7, by means of a Z-axis arm 9 which is coupled to the driving section.

When paste is applied onto a package 11 set on a carrier 10, the following procedures are usually used. At first, the X-axis motor 5 and the Y-axis motor 6 are driven to move the paste supply section 3 to a position where the paste is applied. Then the Z-axis motor 7 is driven to lower the paste supply section 3 until the tip of the needle 2 reaches a predetermined height. Next, the dispense controller 4 is activated to extrude the paste from the syringe 1 and an application operation is started. Under these conditions, the application of the paste in a straight line is performed by driving the X-axis motor 5 and Y-axis motor 6 to move the X-Y table and the paste supply section 3. When the paste supply section 3 reaches the end point of paste application, the dispenser stops its operation, then the Z-axis motor is driven to raise the paste supply section 3, and then the motors 5 and 6 are driven to return the paste supply section 3 to the original point.

However, in the conventional dispenser type die bonding apparatus, when either of a bending of the package 11, a variation of mold height, a variation of height of the top of the package or inclination due to the improper operation of the positioning device (not shown) for the package is generated, the distance between the tip of the needle 2 and the surface to be applied with the paste will not always be constant even if the tip of the needle 2 is moved in the horizontal plane by driving the X-axis motor 5 and Y-axis motor 6.

The proper spacing between the tip of the needle 2 and the pellet mounting surface of the package is considered to be approximately 0.3 mm for an elongated pellet with width of 1 mm. That is, there are problems in that if the space is too narrow, the tip of the needle 2 will contact the surface of the package 11 where the paste is to be applied, and if there is an inclination of the package, the space will not be constant. The same situations are applicable to the case where there is a variation of the height of the package among the product lots.

Figure 2A:
FIG. 2A and FIG. 2B are a plan view and a front view, respectively, showing wavy application of paste by the conventional die bonding apparatus.
Figure 2B:

The relation between the space and the paste application width is as follows:

When the spacing between the tip of the needle 2 and the surface of the package is smaller than the diameter of the cross section of the paste discharged, the paste is pressed by the tip of the needle 2, resulting in a wider application width. On the contrary, when the spacing is too large, the paste application width varies in a wavy pattern due to the high viscosity of the paste as shown in a plan view of FIG. 2A and a front view of FIG. 2B. Accordingly, the desired uniform paste application condition cannot be obtained.

Figure 3A:
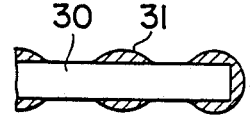
FIG. 3A and FIG. 3B are a plan view and a front view, respectively, illustrating a problem in bonding a pellet.
Figure 3B:
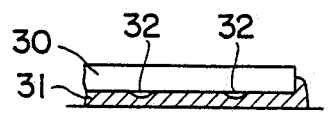

In this condition, when a pellet 30 having approximately 1 mm thickness is die bonded by the abovementioned nonuniform paste, as shown in a plan view of FIG. 3A and a front view of FIG. 3B, some portions of the bottom surface of the pellet 30 are not bonded by the paste. Such non-bonded portions 32 deteriorate the bonding strength, resulting in poor reliability of the product.

Figure 4:
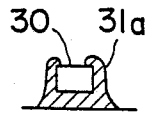
FIG. 4 also illustrates a problem caused by use of conventional die bonding apparatus.

In order to remove the above-mentioned non-bonded portions, the pellet is preferably pressed down so as to be sunk into the paste. However, by this operation, a crawl-up of paste 31a will appear around the pellet as shown in FIG. 4 and this crawl up of paste will become an obstacle for the wire bonding.

Consequently, to realize the uniform paste application condition, the spacing between the tip of the needle 2 and the paste application surface of the package 11 should be maintained at a constant optimum value.

Figure 5:
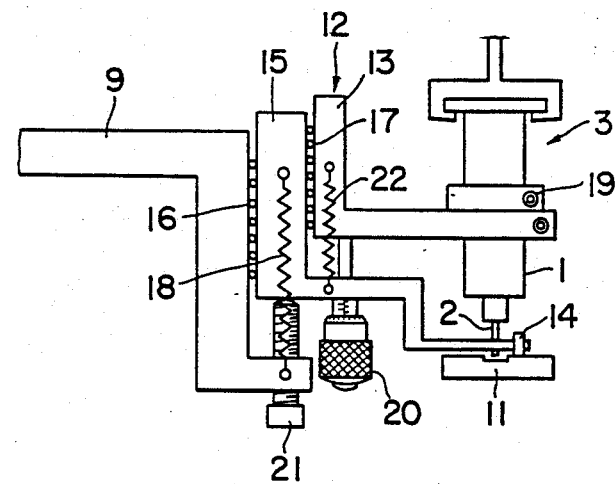
FIG. 5 is a front view of an embodiment of the present invention.

FIG. 5 shows an embodiment of the present invention.

In this embodiment, like that shown in FIG. 1, the die bonding apparatus has a driving section 8 comprising X-axis motor 5, Y-axis motor 6 and Z-axis motor 7 and the apparatus has a paste supply section 3 which has a needle 2 and is connected to the Z-axis arm by means of a follow up mechanism 12.

This follow-up mechanism comprises a syringe holder 13 for holding the syringe 1 and a roller bearing holder 15 for rotatably holding a roller bearing 14. The roller bearing holder 15 is coupled to the Z axis arm 9 to be movable up and down by means of rollers 16 and the syringe holder 13 is coupled to the roller bearing holder 15 to be movable up and down by means of a roller guide 17. Moreover, a tension spring 18 which pulls the paste supply section 3 downward is inserted between the Z-axis arm 9 and the roller bearing holder 15.

When the paste is applied to the surface of the package, the roller bearing 14 rotatably contacts the surface of the package 11, and it moves in the X-Y and up-down directions along the inclination or unevenness of the package without separating the needle tip from the surface of the package. Consequently, the needle 2 of the paste supply section 3 moves in the up-down direction against the spring tension, resulting in a constant spacing between the tip of the needle 2 and the paste application surface of the package 11.

In addition to the above-mentioned construction, the die bonding apparatus according to the present invention further comprises the following members in order to maintain the spacing between the tip of the needle 2 and the paste application surface of the package 11.

Figure 6:
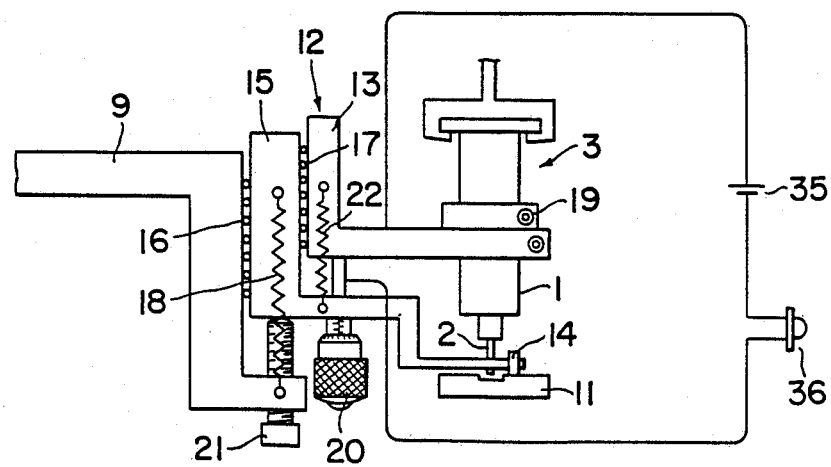
FIG. 6 is a front view of an embodiment of the present invention showing a method for detecting contact of the needle with the surface of the package.

A spacer 19 which is utilized for positioning the syringe 1 at an original position when the syringe 1 is reset after removal during exchange of the needle 2 or during non-operation of the die bonding apparatus, is provided at a predetermined position of the syringe 1. Moreover, a micrometer 20 whose tip is in contact with the bottom surface of the syringe holder 13 is rotatably secured to the roller bearing 14 and a stop member 21 which prevents the roller bearing holder 15 from excessively lowering by touching its tip to the holder 13 is also rotatably secured to the Z-axis arm 9. As shown in FIG. 6, a tension spring 22 is mounted between the syringe holder 13 and the roller bearing holder 15 to which the micrometer 20 is secured and an electric current is caused to flow by means of a battery 35 between the roller bearing holder 15 and the tip of the micrometer 20. By rotating the micrometer 20 after the syringe 1 has been set, the syringe holder 13 is lowered by the pulling force of the tension spring. When the micrometer tip is lowered just after the needle 2 is brought into contact with the paste applying surface of the package 11, the tip of the micrometer 20 is separated from the bottom surface of the syringe holder 13 and then the current is cut off. After detecting this cut off, the needle 2 is raised against spring force by rotating the micrometer 20 to set the needle 2 at a desired height. In this case, the micrometer 20 and the syringe holder 13 are electrically isolated.

When the needle 2 is separated from the surface of the package 11, LED 36 is turned on and when the needle 2 contacts the surface of the package 11, LED 36 is turned off because of the separation of the micrometer tip from the syringe holder 13. According to these procedures, the detection of contact point of needle to the package is conducted.

Besides, it is preferable to secure the needle 2 to the roller bearing holder 15 by means of bolts (not shown) etc. in order to prevent vibration of the needle tip and minute variation of position relative to roller bearing 14.

According to the construction of this embodiment, the roller bearing 14 is moved up and down along the contour of the surface of the package during the movement of the paste supply section 3 and needle 2 in the X and Y directions. Consequently, the needle 2 is moved up and down at the same time, whereby a constant gap can be maintained. By this operation, the uniform application of paste is realized.

FIG. 7 shows another method for confirming the contact height of the needle.

In this embodiment, a second needle 34 is provided to contact with the conductive surface 33 in the package 11, and a battery 35 and an LED 36 are connected in series between needles 2 and 34. The contact of the needle 2 with the conductive surface 33 is detected by observing lighting of the LED 36.

FIGS. 8A and 8B show a further embodiment of the present invention.

This embodiment is different from the former embodiments in that the roller bearing 14 and the roller bearing holder 15, shown in FIGS. 5 and 6, are not provided. Alternatively a pulse motor 24 is provided for the Z-axis arm 9. A needle height adjuster 26 is coupled to a ball screw 27 which is connected to the pulse motor 24. Accordingly, by rotating the pulse motor, the needle height adjuster 26 is moved up-and-down and syringe holder 13, syringe 1 and needle 2 are also moved up-and-down. The needle 2 penetrates into the needle holder 23 which is extended a little from the bottom surface of the needle holder 23. As shown in FIG. 8B, a displacement sensor 25 which measures the distance between the needle holder 23 and the surface of the package is secured to the needle holder 23. Moreover, the syringe support is electrically isolated from the needle height adjuster 26.

This apparatus is used as follows:

At first, the syringe 1 is set to the syringe holder 13 with the needle 2 projecting from bottom surface of the syringe holder 13 by a small length. It is useful to secure the annular positioning spacer 19 to the syringe 1 for remounting after removal of the syringe 1 during non-operation.

Next, the package is moved to a predetermined position, and then the Z-axis motor is driven so as to lower the Z-axis arm 9. The motor is stopped when the value detected by the displacement sensor 25 shows a predetermined height.

Next, the pulse motor 24 is driven to lower the needle height adjuster 26. At this time, syringe holder 13 is also lowered by following the needle height adjuster 26 so as to cause the tip of the needle 2 to contact against to the surface of the package. Detection of this contact is performed by detecting cut-off of the current flowing between the needle height adjuster 26 and the syringe holder 13 by contact detector 40. After detecting the contact of needle 2 to package 11, the pulse motor 24 is stopped and then the motor 24 is driven again in order to obtain desired spacing between the needle 2 and the surface of the package 11.

In applying paste, the spacing between the needle 2 and the package 11 is maintained substantially constant by feeding back a command signal to the pulse motor 24 from the controller 50 according to the variation in the spacing between the displacement sensor 25 and package 11.

Since the present invention has the above-mentioned construction, even if the paste application surface of the package has uneven height or inclination, the spacing between the tip of the needle and the surface of the package is always maintained substantially constant, so that uniform paste application is realized. Accordingly, the bonding strength is improved, and as a result a highly reliable semiconductor device can be produced.

What is claimed is:

1. A die bonding apparatus comprising:
   paste supply means having a needle for supplying paste onto a package to secure a semiconductor pellet;
   driving means for moving said paste supply means in directions of X, Y and Z, respectively;
   follow-up means movable up and down for causing a tip of the needle to follow a contour of a surface of the package; and
   supporting means for supporting said paste supply means by means of said follow up means.

2. The die bonding apparatus according to claim 1, wherein said follow-up means comprises:
   a roller bearing holder which is coupled to a supporting arm to be movable up-and-down, and which supports a roller bearing rotatably;
   a syringe holder which is connected to said roller having holder, said holders being movable up-and-down and said syringe holder supporting said paste supply means by means of a syringe; and
   a spring which biases the syringe holder downward;
   said follow-up means being connected to be movable up and down by a Z axis arm which is connected to a driving section.

3. The die bonding apparatus according to claim 2, wherein said Z-axis arm has a stop member which prevents the roller bearing holder from excessively lowering and which is screwed to the Z-axis arm.

4. The die bonding apparatus according to claim 2 wherein said roller bearing holder comprises:
   a micrometer whose tip contacts the syringe holder and which is threaded through said roller bearing holder;
   current detecting means for detecting a current flowing between the roller bearing holder and the syringe holder, and detecting a contact of the bearing to the package when the current is cut off; and
   a current source which is provided between said roller bearing holder and said micrometer, and supplies said current to be detected by said current detecting means.

5. A die bonding apparatus comprising:
   paste supply means having a needle and supplying a predetermined amount of paste onto a package to secure a semiconductor pellet;
   driving means moving said paste supply means in directions of X, Y and Z, respectively;
   displacement detection means provided adjacent the needle and secured to a Z-axis arm;
   adjusting means for adjusting relative location between a paste supply section and the Z-axis arm; and
   control means for controlling the adjusting means according to said displacement detection means, whereby the spacing between the needle and the surface of the package is maintained substantially constant.

* * * * *